United States Patent [19]

St. Germain et al.

[11] Patent Number: 4,466,679

[45] Date of Patent: Aug. 21, 1984

[54] COMBINATION HANDLE AND COVER

[75] Inventors: Ronald E. St. Germain, Amesbury, Mass.; Paul Zdinak, Derry, N.H.

[73] Assignee: Gould Inc., Rolling Meadows, Ill.

[21] Appl. No.: 470,784

[22] Filed: Mar. 1, 1983

[51] Int. Cl.³ .......................................... H01R 13/447
[52] U.S. Cl. .............................. 339/44 M; 174/138 F; 339/36; 339/108 R; 339/198 J
[58] Field of Search .............. 339/36, 43, 44 R, 44 M, 339/75 P, 75 M, 108 R, 198 J; 174/46, 138 F

[56] References Cited

U.S. PATENT DOCUMENTS

| | | | |
|---|---|---|---|
| 683,579 | 10/1901 | Swoboda | 339/44 R |
| 4,156,794 | 5/1979 | Robinson | 174/46 X |

Primary Examiner—John McQuade
Assistant Examiner—Steven C. Bishop
Attorney, Agent, or Firm—John R. Garrett

[57] ABSTRACT

This disclosure depicts a combination handle and cover apparatus for use with a plug-in device having an electrical terminal strip on a front end. The device is contained within a mainframe assembly. The apparatus comprises first and second means. The first means is for covering the electrical terminal strip and for inserting the device into and removing the device from a mainframe assembly. A second means is attached to the first means and is also hingably attached to the front end of the device such that in an open position the first means functions as a handle and in a closed position the first means functions as a cover.

6 Claims, 5 Drawing Figures

COMBINATION HANDLE AND COVER

BACKGROUND OF THE INVENTION

This invention relates in general to devices constructed to function as handles and covers and in particular to a handle and cover combination for use with a plug-in module device. The invention is for use with a device which has front and back ends and contains electronic circuitry. The device is a plug-in module type device to be used with a mainframe assembly such that the device slides on tracks in the mainframe assembly. When the device is inserted into the mainframe assembly, a plurality of electrical contacts on the back end of the device mate with an electrical connector mounted within the mainframe assembly. The front end of the device typically contains controls such as indicator lights and adjusting means in addition to an electrical terminal strip to which a user can connect wires from other electronic circuits or electrical devices.

It is dangerous for the electrical terminals on the front end of the plug-in device to be exposed. A user, when making adjustments on the front end of the device, may accidentally come in contact with one of the electrical terminals which may carry substantially high voltages. In order to protect against accidental contact, a cover is needed for the electrical terminals. Furthermore, the plug-in module typically fits rather tightly within the mainframe assembly, and it is necessary to have some type of means for grabbing hold of the device to remove it or insert it into the mainframe assembly.

There has been a need in the prior art to have a structure on the device which is aesthetically pleasing and economical to manufacture and which provides a handle for insertion and removal of the device from the mainframe assembly and for covering the electrical terminals on the front end of the device.

The present invention provides a solution to these problems in the prior art.

SUMMARY OF THE INVENTION

The present invention involves a combination handle and cover apparatus for use with a plug-in device having an electrical terminal strip on a front end. The device is contained within a mainframe assembly. The apparatus comprises first and second means. The first means is for covering the electrical terminal strip and for inserting the device into and removing the device from a mainframe assembly. A second means is attached to the first means and is also hingably attached to the front end of the device such that in an open position the first means functions as a handle and in a closed position the first means functions as a cover.

OBJECTS OF THE INVENTION

It is a primary object of the present invention to provide a novel combination handle and cover apparatus for use with a plug-in module device which has an electrical terminal strip located on a front end.

It is another object of the present invention to provide a novel handle and cover apparatus which in an open position functions as a handle and in a closed position functions as a cover for the electrical terminal strip.

It is a further object of the present invention to provide a combination handle and cover apparatus which is economical to manufacture and aesthetically pleasing.

BRIEF DESCRIPTION OF THE DRAWINGS

The features of the present invention which are believed to be novel are set forth with particularity in the appended claims. The invention, together with further objects and advantages, may best be understood by reference to the following description taken in conjunction with the accompanying drawings, in the several figures of which like reference numerals identify like elements, and in which:

DESCRIPTION OF THE PREFERRED EMBODIMENT

Figure 1:
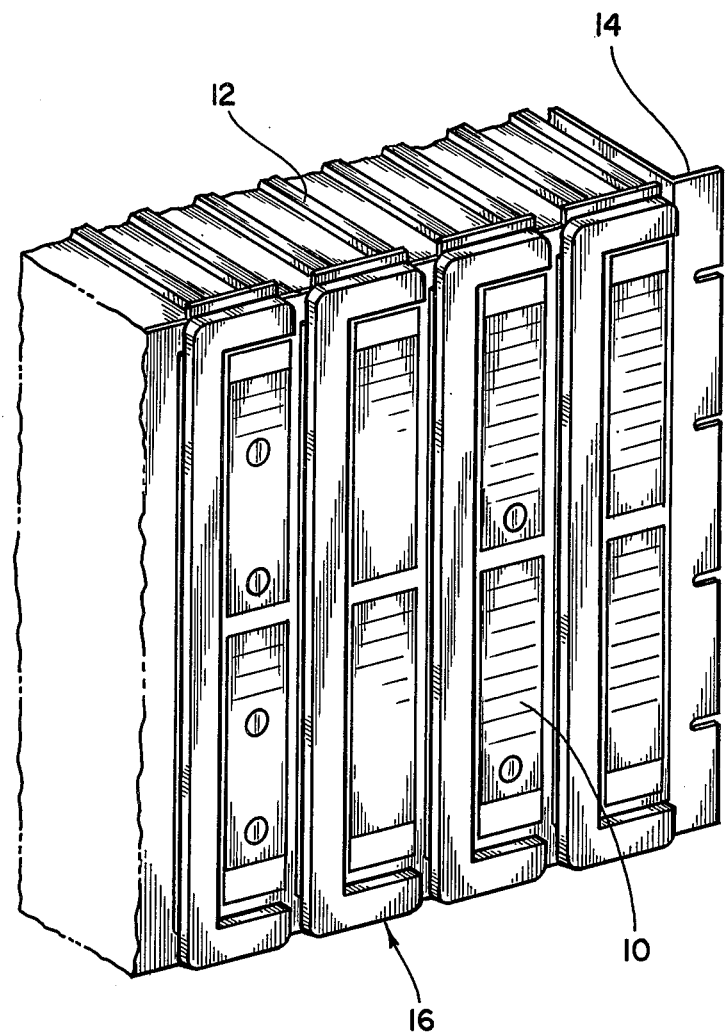
FIG. 1 is a perspective view of the present invention embodied in a plug-in module device which is contained within a mainframe assembly.
Figure 2:
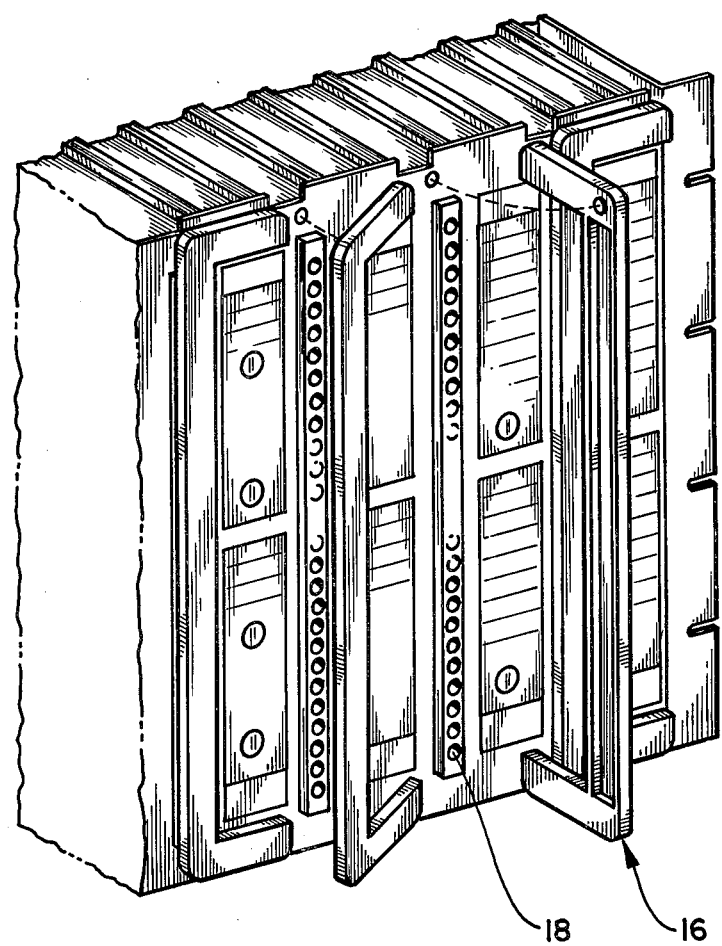
FIG. 2 is a perspective view of the present invention functioning as a handle in an open position.

Whereas the invention may be implemented in various types of devices, it is preferably embodied in a plug-in module device for use with a mainframe assembly of the type shown in FIG. 1. The plug-in module device 10 slides on tracks 12, which is part of the mainframe assembly 14. The novel combination handle and cover apparatus 16 is shown in the closed position in FIG. 1 and gives an aesthetically pleasing appearance to the plug-in module device 10. In FIG. 2, the handle/cover combination 16 is shown in an open position, and an electrical terminal strip 18 can be see on the device 10. In the closed position, the combination handle and cover apparatus 16 functions as a cover, and in an open position, it functions as a handle.

Figure 3:
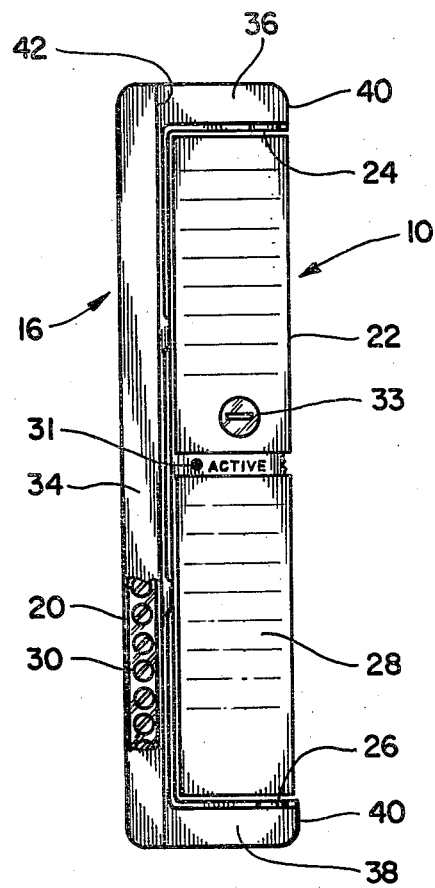
FIG. 3 is a front view of the combination handle and cover apparatus.
Figure 4:
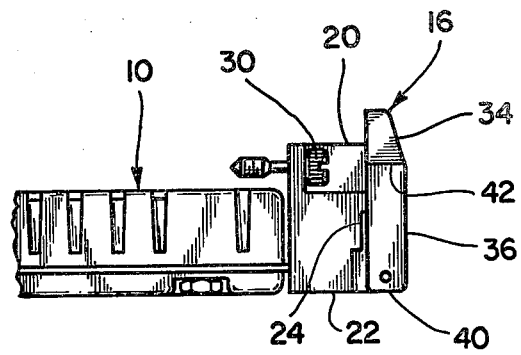
FIG. 4 is an end view of the FIG. 3 apparatus.
Figure 5:
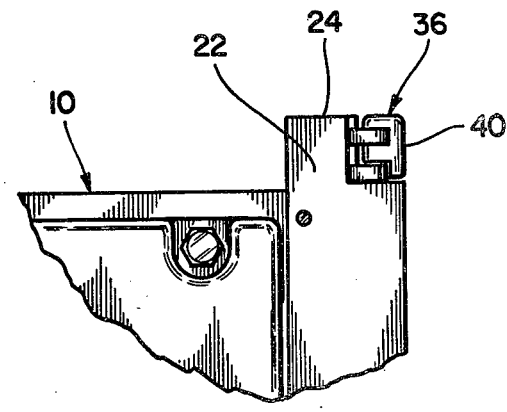
FIG. 5 is a side view of the FIG. 3 apparatus.

The present invention will now be described in more detail. The plug-in module device 10 has a predetermined width and has a substantially rectangular configuration. As shown in FIGS. 3-5, the device 10 has first and second sides 20 and 22 and first and second ends 24 and 26. The device 10 has a front end 28 on which is located along the first side 20 an electrical terminal strip 30 to which a user can attach wires from remote electrical devices. The front face 28 of the device 10 may have any number of indicator lights 31 and/or control means 33, depending upon the application for which electronic circuitry contained within the device 10 is designed.

The novel combination handle and cover apparatus 16 comprises a first means for covering the electrical terminal strip 30 and for inserting the device 10 into and removing the device 10 from the mainframe assembly 14, and a second means which is attached to the first means and also hingably attached to the front end 32 of the device 10 such that in an open position the first means functions as a handle and in a closed position the first means functions as a cover. In the preferred embodiment, the first means is a flat panel 34 which has a width sufficient to cover the electrical terminal strip 30 which is located on the first side 20 of the device 10. The width of the flat panel 34 is less than the width of the device 10. In the preferred embodiment, the second means is a pair of arms 36 and 38, each having one end 40 attached to the second side 22 near the first and second ends 24 and 26 of the device 10. The other end 42 of the arms 36 and 38 is attached to the flat panel 34. In the open position, the arms 36 and 38 extend the flat panel 16 forward such that it can be gripped and used as a handle for inserting or removing the device 10.

Numerous other configurations may be utilized to hingably attach the arms 36 and 38 to the second side 22 of the device 10. Also, numerous other configurations may be used for the flat panel 34.

The invention is not limited to the particular details of the apparatus depicted and other modifications and applications are contemplated. Certain other changes may be made in the above-described apparatus without departing from the true spirit and scope of the invention herein involved. It is intended, therefore, that the subject matter in the above depiction shall be interpreted as illustrative and not in a limiting sense.

What is claimed is:

1. A combination handle and cover apparatus for use with a plug-in device having an electrical terminal strip on a front end, said device contained within a mainframe assembly, said apparatus comprising:
   first means for covering the electrical terminal strip and for inserting the device into and removing the device from the mainframe assembly; and
   second means attached to said first means and also hingably attached to the front end of the device such that in an open position, said first means functions as a handle and in a closed position, said first means functions as a cover.

2. The apparatus described in claim 1 wherein the front end of the device has a predetermined width and has a substantially rectangular configuration with first and second sides, the electrical terminal strip being positioned along a first side of the device and also wherein said first means is a flat panel having a width sufficient to cover the electrical terminal strip on said first side of the device and less than the width of the device, and wherein said second means is hingably attached to said second side of the device.

3. The apparatus described in claim 2 wherein the front end of the device has first and second ends connecting said first and second sides, and said second means is a pair of arms having one end attached to said second side near said first and second ends respectively, the other end of said arms being attached to said flat panel.

4. A modular plug-in electrical device for use with a mainframe assembly, said device comprising:
   a front end having first and second sides and first and second ends connecting said first and second sides;
   an electrical terminal strip located on said first side of said front end of the device;
   first means for covering the electrical terminal strip and for inserting the device into and removing the device from the mainframe assembly, said first means having a width sufficient to cover said electrical terminal strip but less than said width of the device; and
   second means attached to said first means and also hingably attached to said front end of said device along said second side such that in an open position said first means functions as a handle and in a closed position said first means functions as a cover.

5. The apparatus described in claim 4 wherein said first means comprises a flat panel.

6. The apparatus described in claim 5 wherein said second means is a pair of arms having one end attached to said second side of said device near said first and second ends and the other end of said arms attached to said flat panel.

* * * * *